(12) United States Patent
Shin et al.

(10) Patent No.: US 10,389,357 B2
(45) Date of Patent: Aug. 20, 2019

(54) LEVEL SHIFTER AND DISPLAY DEVICE INCLUDING THE SAME

(71) Applicant: SILICON WORKS CO., LTD., Daejeon-si (KR)

(72) Inventors: Yoon Soo Shin, Seoul (KR); Ji Woong Han, Seongnam-si (KR); Hun Choi, Jeonju-si (KR)

(73) Assignee: SILICON WORKS CO., LTD. (KR)

( * ) Notice: Subject to any disclaimer, the term of this patent is extended or adjusted under 35 U.S.C. 154(b) by 569 days.

(21) Appl. No.: 14/965,003

(22) Filed: Dec. 10, 2015

(65) Prior Publication Data

US 2016/0182048 A1    Jun. 23, 2016

(30) Foreign Application Priority Data

Dec. 18, 2014  (KR) .......................... 10-2014-0183386

(51) Int. Cl.
*G09G 3/36* (2006.01)
*H03K 19/0175* (2006.01)
*G09G 3/3258* (2016.01)

(52) U.S. Cl.
CPC ... *H03K 19/017509* (2013.01); *G09G 3/3258* (2013.01); *G09G 3/3648* (2013.01); *G09G 2310/08* (2013.01)

(58) Field of Classification Search
CPC ... G09G 2300/0871; G09G 2300/0838; G09G 2310/0286; G09G 2310/0289; G09G 3/3677; G09G 3/36; G09G 2310/0294; G09G 2330/021; G09G 3/3258; G09G 3/3648; G09G 2310/08; G11C 27/02; H01L 27/1207; H01L 29/66969; H01L 29/7869; H05K 5/0017; H03K 19/017509
See application file for complete search history.

(56) References Cited

U.S. PATENT DOCUMENTS 8,390,556 B2    3/2013  Smith et al.
2012/0098800 A1*  4/2012  Kim .................... G09G 3/3677
                                                       345/204
2014/0028639 A1*  1/2014  Kim ..................... G09G 5/001
                                                       345/204

FOREIGN PATENT DOCUMENTS

KR    10-2014-0050150    4/2014
KR    10-2014-0097891    8/2014
KR    10-2015-0072705    6/2015

OTHER PUBLICATIONS

Author: Hyeok-Su Kwon Title: Display Device (machine translated) Publication Date: Aug. 7, 2014 Publisher: The Korean Intellectual Property Office Application No. 10-2013-0010593.*

* cited by examiner

*Primary Examiner* — Lunyi Lao
*Assistant Examiner* — Jarurat Suteerawongsa
(74) *Attorney, Agent, or Firm* — Polsinelli PC

(57) ABSTRACT

A level shifter may include: a phase controller configured to determine the number of phases of a gate pulse, using an on input signal and an off input signal, and generate a control signal according to the determined number; a switching controller configured to generate one or more switching signals in response to the control signal; and an output buffer configured to generate the level-shifted gate pulse in response to the one or more switching signals.

11 Claims, 7 Drawing Sheets

LEVEL SHIFTER AND DISPLAY DEVICE INCLUDING THE SAME

BACKGROUND

1. Technical Field

The present disclosure relates to a level shifter and a display device including the same.

2. Related Art

With the rapid development of semiconductor technology, display devices have been reduced in size and weight. A flat panel display such as liquid crystal display (LCD) or organic light emitting diode (OLED) has relatively small power consumption, while the flat panel display can be easily reduced in size and weight. The flat panel display may include a gate driver which is directly formed or attached on a display panel through a GIP (Gate In Panel) method.

In order to reduce the bezel width and power consumption of the display panel, the display panel is developed in such a manner that the number of phases of a gate pulse is increased. Furthermore, each type of display panel requires a different number of phases of a gate pulse.

PRIOR ART DOCUMENT

Patent Document (Patent Document 1) U.S. Pat. No. 8,390,556

SUMMARY

Various embodiments are directed to a level shifter capable of adopting the number of phases of a gate pulse without adding a separate register.

Also, various embodiments are directed to a display device capable of adopting the number of phases of a gate pulse without adding a separate register.

In an embodiment, a level shifter may include: a phase controller configured to determine the number of phases of a gate pulse, using an on input signal and an off input signal, and generate a control signal according to the determined number; a switching controller configured to generate one or more switching signals in response to the control signal; and an output buffer configured to generate the level-shifted gate pulse in response to the one or more switching signals.

The phase controller may determine the number of phases based on the input sequence or input counts of the on input signal and the off input signal. When the off input signal is inputted after x clocks of the on input signal where x is a natural number, the phase controller may set the number of phases to 2x.

The output buffer may include: a pull-up element coupled between a gate high voltage terminal and an output node; a pull-down element coupled between a gate low voltage terminal and the output node; and a modulation element coupled to the output node and an external voltage terminal. The external voltage may be larger than a gate low voltage and smaller than a gate high voltage. The level shifter may further include a resistor arranged between the output node and the external voltage terminal. The one or more switching signals may include a first switching signal for turning on/off the pull-up element, a second switching signal for turning on/off the pull-down element, and a third switching signal for turning on/off the modulation element.

In another embodiment, a display device may include: a display panel including a plurality of gate lines, a plurality of data lines, and a plurality of cells; a timing controller configured to provide an input signal according to timing; a level shifter configured to provide a plurality of gate pulses in response to the input signal; a gate driver configured to receive the plurality of gate pulses and drive the plurality of gate lines; and a source driver configured to provide a plurality of data signals to the plurality of data lines. The level shifter may include: a phase controller configured to determine the number of phases using an on input signal and an off input signal, and generate a control signal according to the determined number; a switching controller configured to generate one or more switching signals in response to the control signal; and an output buffer configured to generate the level-shifted gate pulse in response to the one or more switching signals.

The phase controller may determine the number of phases based on the input sequence or input counts of the on input signal and the off input signal.

When the off input signal is inputted after x clocks of the on input signal where x is a natural number, the phase controller may set the number of phases to 2x.

The output buffer may include: a pull-up element coupled between a gate high voltage terminal and an output node; a pull-down element coupled between a gate low voltage terminal and the output node; and a modulation element coupled to the output node and an external voltage terminal. The external voltage may be larger than a gate low voltage and smaller than a gate high voltage. The level shifter may further include a resistor arranged between the output node and the external voltage terminal. The one or more switching signals may include a first switching signal for turning on/off the pull-up element, a second switching signal for turning on/off the pull-down element, and a third switching signal for turning on/off the modulation element.

In another embodiment, a level shifter may include: a phase controller configured to generate one or more control signals of which the number is determined according to an input relation between an on input signal and an off input signal, and sequentially output the control signals in response to the on input signal; a plurality of switching controllers configured to generate one or more switching signals in response to the control signals; and a plurality of output buffers configured to sequentially output level-shifted gate pulses in response to the switching signals.

The phase controller may determine the number of control signals according to the number of clocks of the on input signal, which are inputted until the off input signal is received after the on input signal is received.

DETAILED DESCRIPTION

Figure 1:
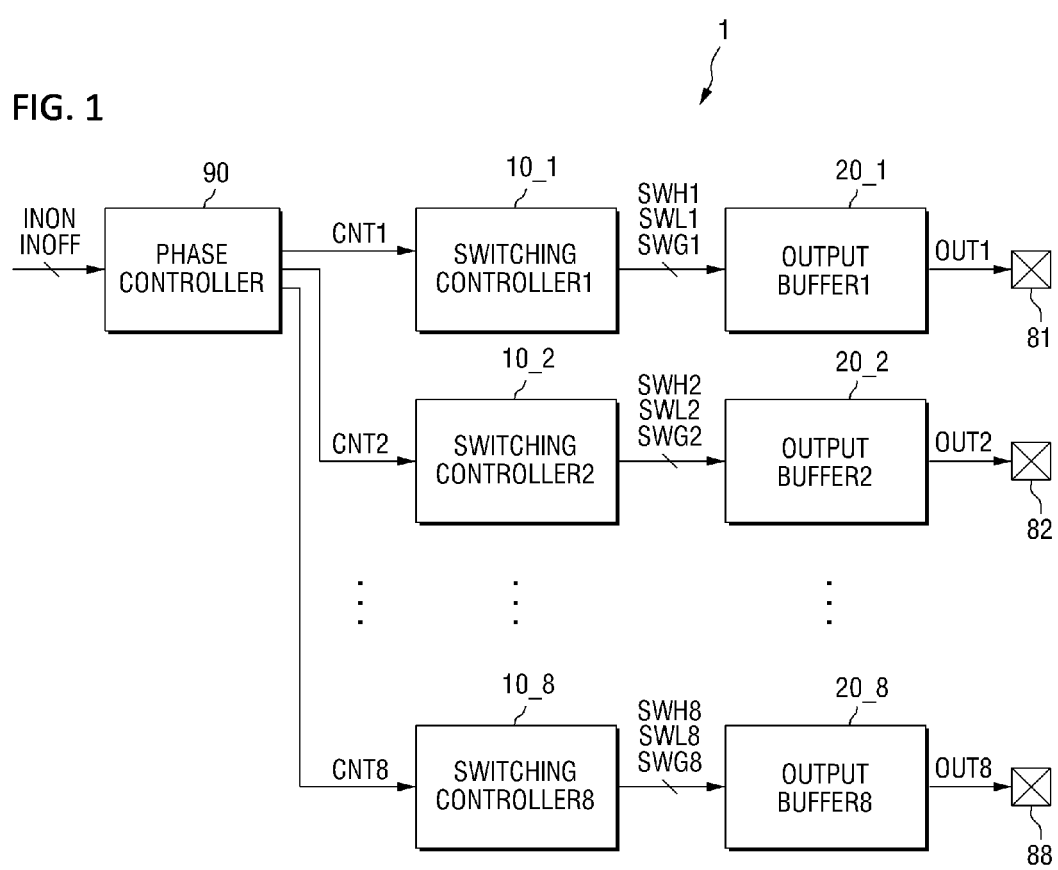
FIG. 1 is a block diagram illustrating a level shifter in accordance with an embodiment of the present invention.

Exemplary embodiments will be described below in more detail with reference to the accompanying drawings. The disclosure may, however, be embodied in different forms and should not be constructed as limited to the embodiments set forth herein. Rather, these embodiments are provided so that this disclosure will be thorough and complete, and will fully convey the scope of the disclosure to those skilled in the art.

Throughout the disclosure, like reference numerals refer to like parts throughout the various figures and embodiments of the disclosure.

When one element is referred to as being "connected to" or "coupled to" another element, it may indicate that the former element is directly coupled or coupled to the latter element or another element is interposed therebetween. On the other hand, when one element is referred to as being "directly connected to" or "directly coupled to" another element, it may indicate that no element is interposed therebetween.

Throughout the disclosure, like reference numerals refer to like elements. Furthermore, "and/or" includes each of described items and one or more combinations thereof.

Although the terms such as first and second are used to describe various elements, components, and/or sections, the elements, components, and/or sections are not limited to the terms. The terms are used only to distinguish one element, component, or section from another element, component, or section. Thus, a first element, first component, or first section described below may indicate a second element, second component, or second section within the scope of the present invention.

The terms used in this specification are used only to explain embodiments while not limiting the present invention. In the specification, the terms of a singular form may include plural forms unless referred to the contrary. The meaning of "comprise" or "comprising" used in the specification specifies a component, a step, an operation, and/or element but does not exclude other components, steps, operations, and/or elements.

All of the terms used in this specification will be used as meanings which can be commonly understood by those skilled in the art to which the present invention pertains, as long as the terms are defined as different meanings. The terms may include technical and scientific terms. Furthermore, terms defined in generally used dictionaries must not be analyzed ideally or overstated unless defined specifically.

FIG. 1 is a block diagram illustrating a level shifter in accordance with an embodiment of the present invention.

Referring to FIG. 1, the level shifter 1 in accordance with the embodiment of the present invention may include a phase controller 90, a plurality of switching controllers 10_1 to 10_8, and a plurality of output buffers 20_1 to 20_8. For convenience of description, FIG. 1 illustrates that the level shifter 1 includes eight switching controllers 10_1 to 10_8 and eight output buffers 20_1 to 20_8. However, the present invention is not limited thereto.

The phase controller 90 receives an on input signal INON and an off input signal INOFF, and determines the numbers of phases of gate pulses OUT1 to OUT8. The on input signal INON is a signal for determining the active timings of the gate pulses OUT1 to OUT8, and the off input signal INOFF is a signal for determining the inactive timings of the gate pulses OUT1 to OUT8.

The phase controller 90 may determine the numbers of phases, based on the input sequence or input count of the on input signal INON and the off input signal INOFF. That is, the phase controller 90 may consider both of the input sequence and the input count, or consider only the input sequence or the input count.

For example, when the off input signal INOFF is inputted after x clocks of the on input signal INON where x is a natural number, the number of phases may correspond to 2x. For example, when the off input signal INOFF is inputted after four clocks of the on input signal INON, the number of phases may be set to eight. Furthermore, when the off input signal INOFF is inputted after three clocks of the on input signal INON, the number of phases may be set to six.

The phase controller 90 generates control signals CNT1 to CNT8 of which the number is determined according to the input relation between the on input signal INON and the off input signal INOFF, and sequentially outputs the control signals CNT1 to CNT8 in response to the on input signal INON.

For example, the phase controller 90 may determine the number of control signals CNT1 to CNT8 according to the number of clocks of the on input signal INON, which are inputted until the off input signal INOFF is received after the on input signal INON is received. The number of control signals CNT1 to CNT8 is used to set the number of phases of the gate pulses OUT1 to OUT8.

The plurality of switching controllers 10_1 to 10_8 receive the corresponding control signals CNT1 to CNT8. The switching controllers 10_1 to 10_8 generate one or more switching signals SWH1 to SWH8, SWL1 to SWL8, and SWG1 to SWG8 according to the control signals CNT1 to CNT8. For example, according to the levels of the control signals CNT1 to CNT8 (that is, first or second level), the operations of the corresponding switching controllers 10_1 to 10_8 may be differently performed. That is, the switching controller 10_1 receiving the first-level control signal CNT1 may generate the switching signals SWH1, SWL1, and SWG1 such that the gate pulse OUT1 is generated. On the other hand, the switching controller 10_8 receiving the second-level control signal CNT8 generates the switching signals SWH8, SWL8, and SWG8 such that the gate pulse OUT8 is not generated (refer to FIG. 8).

The plurality of output buffers 20_1 to 20_8 receive one or more switching signals SWH1 to SWH8, SWL1 to SWL8, and SWG1 to SWG8, respectively. The output buffers 20_1 to 20_8 generate the level-shifted gate pulses OUT1 to OUT8 according to the corresponding switching signals SWH1 to SWH8, SWL1 to SWL8, and SWG1 to SWG8. The gate pulses OUT1 to OUT8 may be provided to the outside (for example, gate lines) through first pads 81 to 88, respectively. Although not illustrated, the output buffers 20_1 to 20_8 may be coupled to an external voltage VDC (refer to FIG. 2).

For example, when the phase controller 90 sets the number of phases to eight, eight output buffers 20_1 to 20_8 may output eight gate pulses OUT1 to OUT8 at different timings.

Alternatively, when the phase controller 90 sets the number of phases to six, six output buffers may output eight gate pulses at different timings. The six output buffers may be selected from the eight output buffers 20_1 to 20_8. For example, the six output buffers may be set to the output buffers 20_1 to 20_6 or the output buffers 20_1 to 20_3 and 20_5 to 20_7.

The level shifter 1 in accordance with the embodiment of the present invention does not need a separate register for setting the number of phases. That is, the number of phases does not need to be previously stored in a register, but the phase controller 90 may set the number of phases in real time, based on the on input signal INON and the off input signal INOFF. Thus, a separate level shifter does not need to be manufactured according to the size of the display panel.

Figure 2:
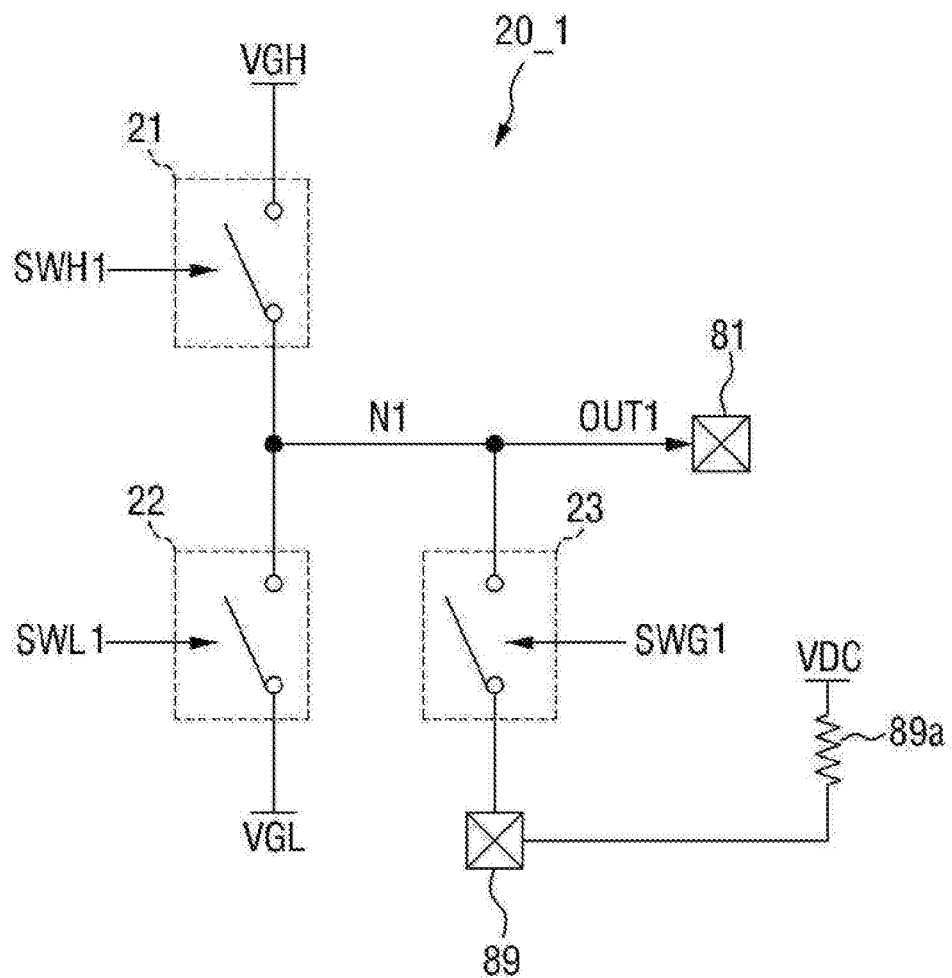
FIG. 2 is a circuit diagram for describing an output buffer of FIG. 1.

FIG. 2 is a circuit diagram for describing the output buffer of FIG. 1.

FIG. 2 illustrates the output buffer 20_1, but the other output buffers 20_2 to 20_8 may have substantially the same configuration as the output buffer 20_1.

Referring to FIG. 2, the output buffer 20_1 receives a gate high voltage VGH and a gate low voltage VGL. The gate pulse OUT1 may swing between the gate high voltage VGH and the gate low voltage VGL.

The output buffer 20_1 may include a pull-up element 21, a pull-down element 22, and a modulation element 23.

The pull-up element 21 is coupled between the gate high voltage terminal VGH and an output node N1. The pull-up element 21 may be turned on/off according to the first switching signal SWH1.

The pull-down element 22 is coupled between the gate low voltage terminal VGL and the output node N1. The pull-down element 22 may be turned on/off according to the second switching signal SWL1.

The modulation element 23 is coupled between the output node N1 and the second pad 89. The modulation element 23 may be coupled to an external voltage terminal VDC through the second pad 89. The modulation element 23 may be turned on/off according to the third switching signal SWG1. Between the second pad 89 and the external voltage terminal VDC, a resistor 89a may be selectively arranged. That is, depending on cases, the external voltage VDC may be directly provided to the second pad 89 without the resistor 89a.

The external voltage VDC is larger than the gate low voltage VGL and smaller than the gate high voltage VGH. The external voltage VDC may be used for a GPM (Gate Pulse Modulation) operation.

In a flat panel display device, a gate driver may be directly formed or attached on a display panel through a GIP (Gate In Panel) method. In this case, a high voltage needs to be driven due to the characteristic of the GIP method. However, when a high voltage is used, power consumption may be increased, and an abnormal effect such as flicker or crosstalk may occur. In order to overcome such a problem, the GPM method is used.

When a GPM rising operation is performed, the gate pulse OUT1 may ascend in a stepwise manner. That is, the gate pulse OUT1 may not directly ascend from the gate low voltage VGL to the gate high voltage VGH, but ascend to one or more external voltages VDC from the gate low voltage VGL and then ascend to the gate high voltage VGH after a predetermined time. That is, the gate pulse OUT1 may ascend in a stepwise manner including two or more steps.

When a GPM falling operation is performed, the gate pulse OUT1 may descend in a stepwise manner. That is, the gate pulse OUT1 may not directly descend from the gate high voltage VGH to the gate low voltage VGL, but descend to one or more external voltages VDC from the gate high voltage VGH and then descend to the gate low voltage VGL. That is, the gate pulse OUT1 may descend in a stepwise manner including two or more steps.

At this time, both of the GPM rising operation and the GPM falling operation may be used, or only one of the GPM rising operation and the GPM falling operation may be used.

Figure 3:
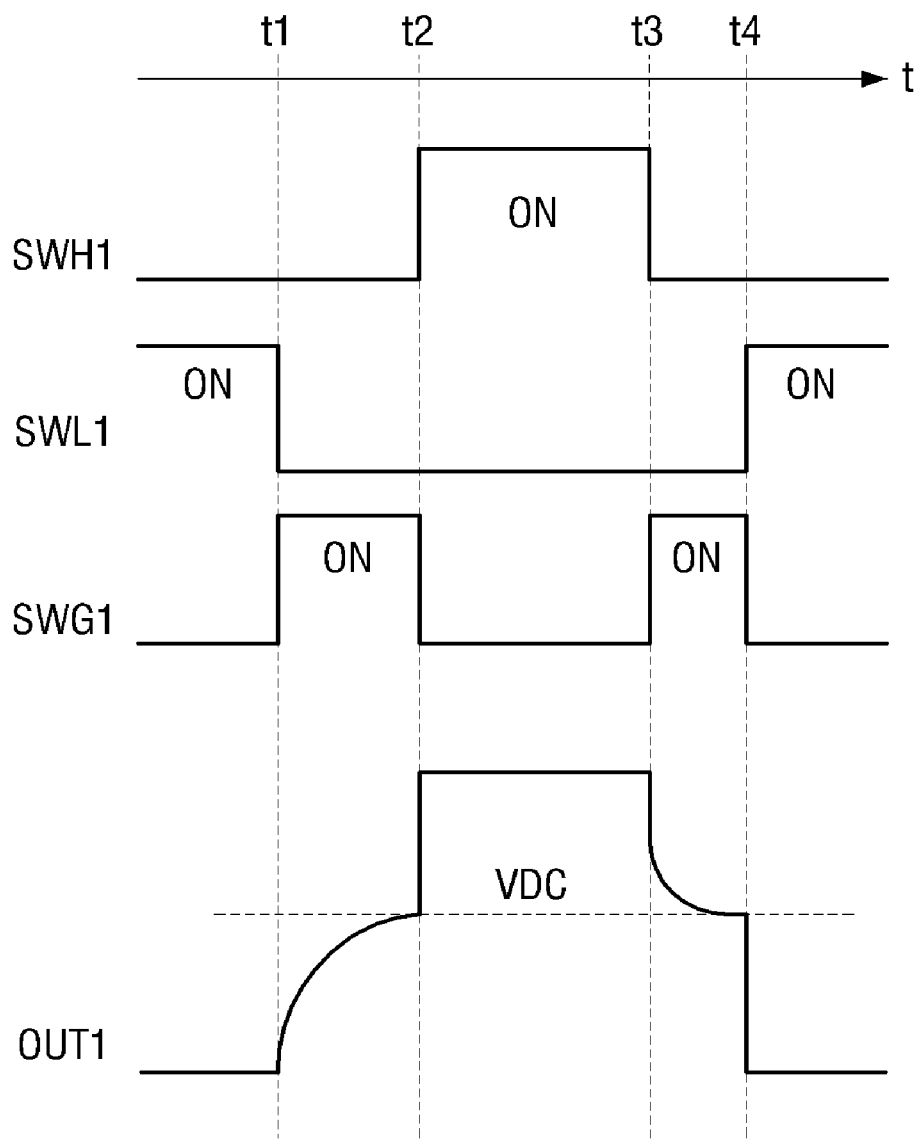
FIG. 3 is a timing diagram for describing the operation of the output buffer of FIG. 2.

FIG. 3 is a timing diagram for describing the operation of the output buffer of FIG. 2.

Referring to FIGS. 2 and 3, the first switching signal SWH1 is at an off level (for example, low level), the second switching signal SWL1 is at an on level (for example, high level), and the third switching signal SWG1 is at the off level, before a time t1. Thus, the pull-up element 21 is turned off, the pull-down element 22 is turned on, and the modulation element 23 is turned off. Therefore, the gate pulse OUT1 maintains the level of the gate low voltage VGL.

At the time t1, the first switching signal SWH1 is still at the off level, the second switching signal SWL1 transitions to the off level, and the third switching signal SWG1 transitions to the on level. Thus, the pull-up element 21 maintains the off state, the pull-down element 22 is turned off, and the modulation element 23 is turned on. Therefore, the gate pulse OUT1 rises from the level of the gate low voltage VGL to the level of the external voltage VDC.

At a time t2, the first switching signal SWH1 transitions to the on level, the second switching signal SWL1 maintains the off level, and the third switching signal SWG1 transitions to the off level. Thus, the pull-up element 21 is turned on, the pull-down element 22 maintains the off state, and the modulation element 23 is turned off. Therefore, the gate pulse OUT1 rises from the level of the external voltage VDC to the level of the gate high voltage VGH.

In other words, the GPM rising operation is performed from the time t1 to the time t2. That is, the gate pulse OUT1 may ascend in a stepwise manner from the gate low voltage VGL to the gate high voltage VGH.

At a time t3, the first switching signal SWH1 transitions to the off level, the second switching signal SWL1 maintains the off level, and the third switching signal SWG1 transitions to the on level. Thus, the pull-up element 21 is turned off, the pull-down element 22 maintains the off state, and the modulation element 23 is turned on. Therefore, the gate pulse OUT1 falls from the level of the gate high voltage VGH to the level of the external voltage VDC.

At a time t4, the first switching signal SWH1 maintains the off level, the second switching signal SWL1 transitions to the on level, and the third switching signal SWG1 transitions to the off level. Thus, the pull-up element 21 maintains the off state, the pull-down element 22 is turned on, and the modulation element 23 is turned off. Therefore, the gate pulse OUT1 falls from the level of the external voltage VDC to the level of the gate low voltage VGL.

In other words, the GPM falling operation is performed from the time t3 to the time t4. That is, the gate pulse OUT1 may descend in a stepwise manner from the gate high voltage VGH to the gate low voltage VGL.

Figure 4:
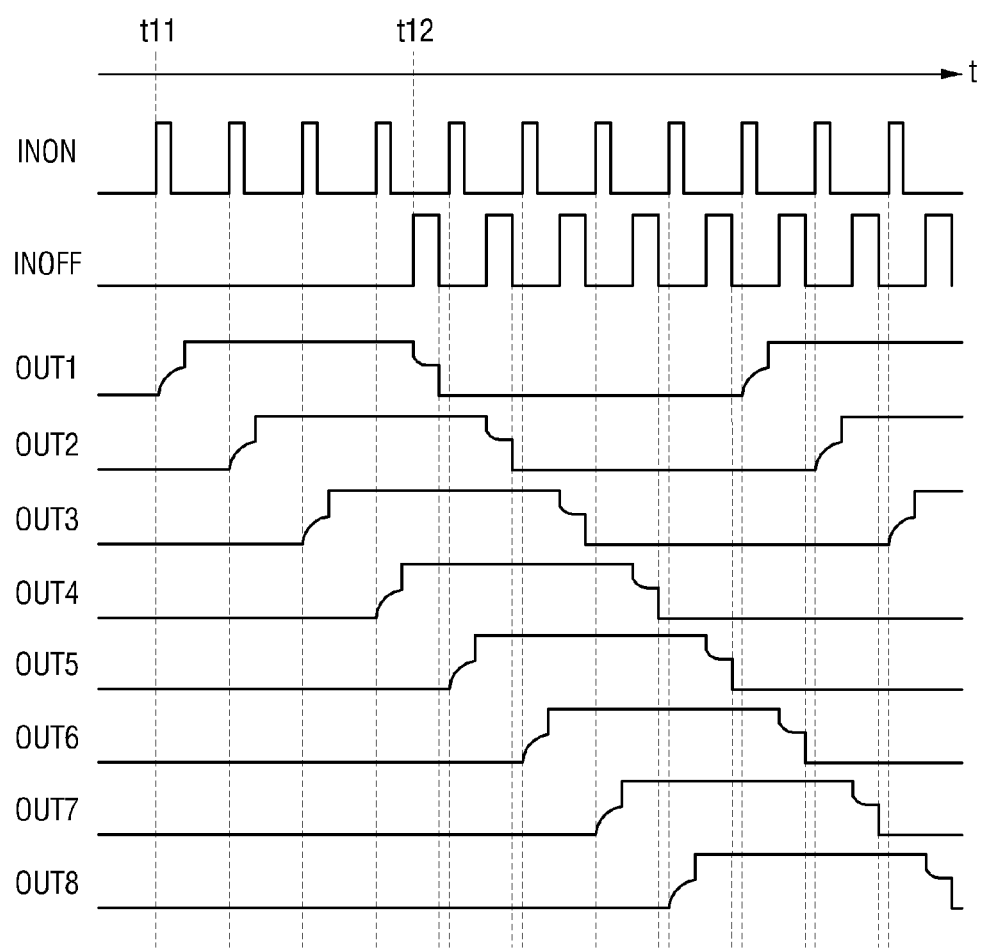
FIG. 4 is a timing diagram for describing an example of the operation of the level shifter of FIG. 1.

FIG. 4 is a timing diagram for describing an example of the operation of the level shifter of FIG. 1.

Referring to FIGS. 1 and 4, the on input signal INON may be inputted at a time t11, and the off input signal INOFF may be inputted at a time t12. That is, after four clocks of the on input signal INON, the off input signal INOFF is inputted. In this case, the phase controller 90 may set the number of phases to eight.

Thus, the eight output buffers 20_1 to 20_8 may sequentially output the eight gate pulses OUT1 to OUT8 at different timings.

For example, the gate pulse OUT1 may rise in response to the first clock of the on input signal INON (GPM rising), and fall in response to the first clock of the off input signal INOFF (GPM falling). Similarly, the gate pulse OUT2 may rise in response to the second clock of the on input signal INON (GPM rising), and fall in response to the second clock of the off input signal INOFF (GPM falling).

Figure 5:
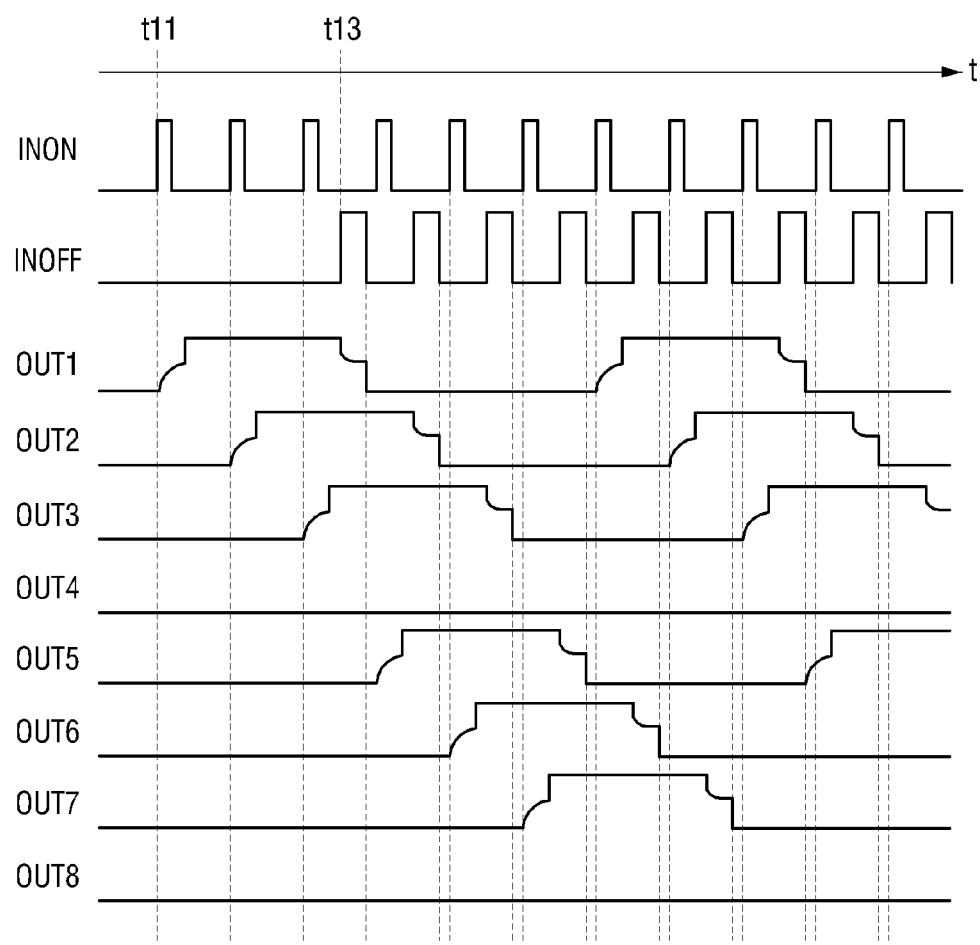
FIG. 5 is a timing diagram for describing another example of the operation of the level shifter of FIG. 1.

FIG. 5 is a timing diagram for describing another example of the operation of the level shifter of FIG. 1.

Referring to FIGS. 1 and 5, the on input signal INON may be inputted at a time t11, and the off input signal INOFF may be inputted at a time t13. That is, after three clocks of the on input signal INON, the off input signal INOFF is inputted. In this case, the phase controller 90 may set the number of phases to six.

Thus, six output buffers 20_1 to 20_3 and 20_5 to 20_7 among the eight output buffers 20_1 to 20_8 may sequentially output six gate pulses OUT1 to OUT3 and OUT5 to OUT7 at different timings. However, the selected six output buffers 20_1 to 20_3 and 20_5 to 20_7 may be changed according to a design method or used display panel.

Figure 6:
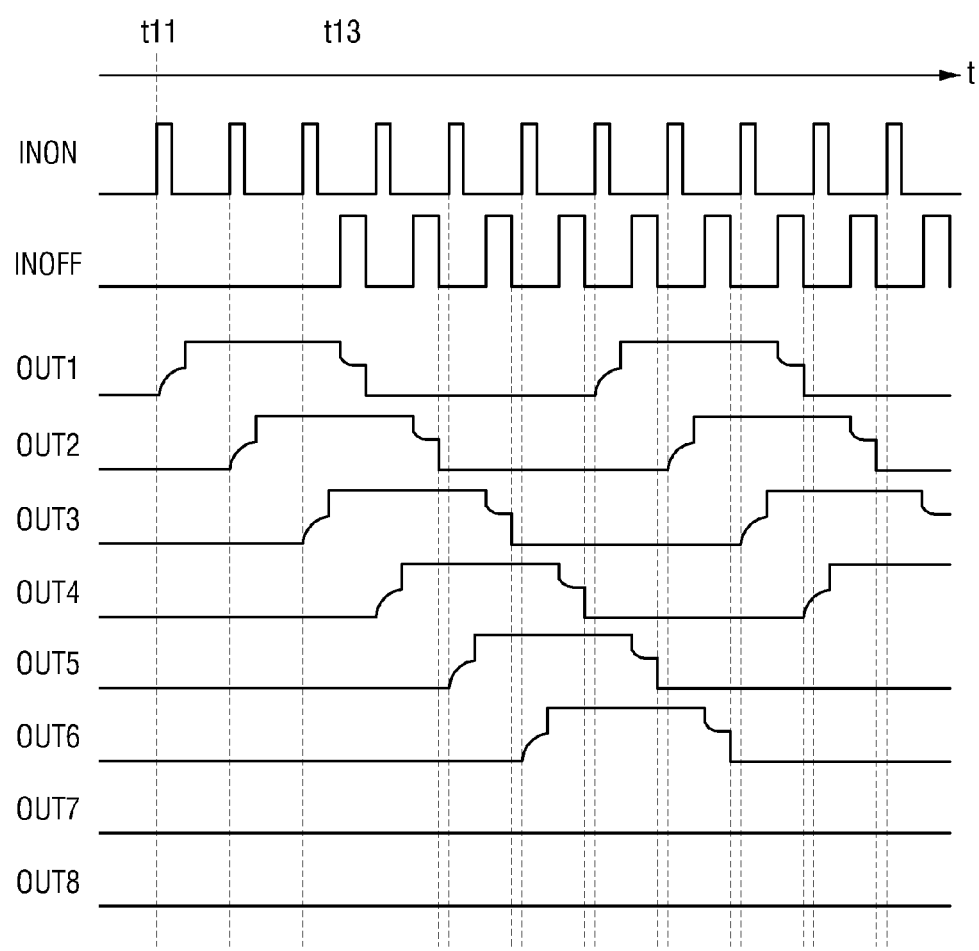
FIG. 6 is a timing diagram for describing another example of the operation of the level shifter of FIG. 1.

FIG. 6 is a timing diagram for describing another example of the operation of the level shifter of FIG. 1. For convenience of description, the descriptions of the same components as those of FIG. 5 are omitted therein.

Referring to FIGS. 1 and 6, the off input signal INOFF is inputted after three clocks of the on input signal INON.

Thus, the phase controller 90 may set the number of phases to six. At this time, six output buffers 20_1 to 20_6 among the eight output buffers 20_1 to 20_8 may sequentially output six gate pulses OUT1 to OUT6 at different timings.

Figure 7:
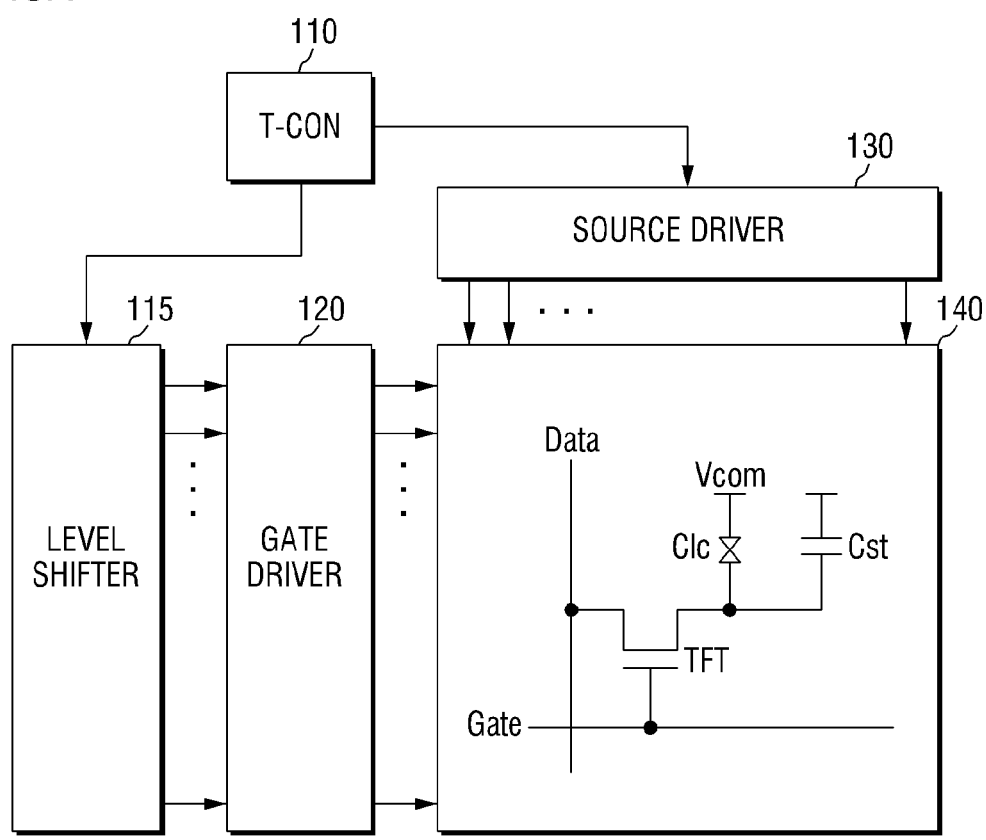
FIG. 7 is a block diagram for describing a display device to which the level shifter in accordance with the embodiment of the present invention is applied.

FIG. 7 is a block diagram for describing a display device to which the level shifter in accordance with the embodiment of the present invention is applied. That is, FIG. illustrates the display device to which the level shifter described with reference to FIGS. 1 to 6 is applied. For convenience of description, an LCD device will be taken as an example. For example, however, the level shifter can be applied to a flat panel display device such as OLED.

Referring to FIG. 7, the display device to which the level shifter in accordance with the embodiment of the present invention is applied includes a display panel 140, the level shifter 115, a gate driver 120, a source driver 130, and a timing controller 110.

The display panel 140 includes liquid crystal molecules arranged between two glass substrates, for example. The display panel 140 includes m×n liquid crystal cells Clc arranged in a matrix shape through a cross structure of data lines and gate lines, where m and n are positive integers.

The bottom glass substrate of the display panel 140 includes a pixel array formed therein, the pixel array including m data lines, n gate lines, TFTs (Thin Film Transistors), pixel electrodes of the liquid crystal cells Clc connected to the respective TFTs, and a storage capacitor Cst.

The top glass substrate of the display panel 140 may include a black matrix, a color filter, and a common electrode formed thereon. The common electrode is formed on the top glass substrate in a vertical electric field driving method such as TN (Twisted Nematic) mode or VA (Vertical Alignment) mode, and formed on the bottom glass substrate with the pixel electrodes in a horizontal electric field driving method such as IPS (In-Plane Switching) mode or FFS (Fringe Field Switching) mode.

Each of the top and bottom glass substrates of the display panel 140 includes a polarizing plate attached thereon, the polarizing plate crossing the optical axis at right angles. Furthermore, each of the top and bottom glass substrates of the display panel 140 includes an alignment film which is formed on the inner surface contacted with the liquid crystal, in order to set a pretilt angle.

Under control of the timing controller 110, the source driver 130 latches digital video data RGB, converts the digital video data into an analog positive/negative gamma voltage, and generates a positive/negative data voltage. The source driver 130 supplies a data voltage to the data lines.

Data drive ICs may be mounted on a TCP (Tape Carrier Package) and bonded to the bottom glass substrate of the display panel 140 through a TAB (Tape Automated Bonding) process.

The level shifter 115 may include the level shifters described with reference to FIGS. 1 to 6. Under the control of the timing controller 110, the level shifter 115 may provide gate pulses having a pulse width of approximately one horizontal period to the input terminal of the gate driver 120.

The gate driver 120 receives the gate pulses to drive a gate line.

For example, the level shifter 115 may be implemented as a separate chip, and the gate driver 120 may be directly formed on the bottom glass substrate at the same time as the pixel array through the GIP process. The timing controller 110 realigns digital video data RGB inputted from a system board (not illustrated) according to the display panel 140, and supplies the realigned data to the source driver 130. The timing controller 110 receives timing signals such as a vertical/horizontal synchronous signal Vsync/Hsync, a data enable signal, and a clock signal CLK from the system board, and generates signals for controlling the operation timings of the source driver 130 and the level shifter 115.

While various embodiments have been described above, it will be understood to those skilled in the art that the embodiments described are by way of example only. Accordingly, the disclosure described herein should not be limited based on the described embodiments.

What is claimed is:

1. A level shifter comprising:
a phase controller configured to determine the number of phases of a plurality of gate pulses, using an on input signal and an off input signal, and sequentially generate a plurality of control signals according to the determined number;
a plurality of switching controllers configured to generate one or more switching signals in response to the plurality of control signals sequentially provided from the phase controller; and
a plurality of output buffers configured to sequentially generate level-shifted gate pulses in response to the one or more switching signals provided from the plurality of switching controllers,
wherein the phase controller determines a number of the control signals in accordance with a number of clocks of the on input signal between a time at which the on input signal is inputted and another time at which the off input signal is inputted, and generates the plurality of control signals sequentially activated in response to the on input signal, and
wherein the number of the phases of the gate pulses is determined in accordance with the number of the control signals,
wherein the on input signal and the off input signal are different.

2. The level shifter of claim 1, wherein the phase controller determines the number of phases based on an input sequence or input counts of the on input signal and the off input signal.

3. The level shifter of claim 2, wherein the phase controller sets the number of phases to 2x when the off input signal is inputted after x clocks of the on input signal where x is a natural number.

4. The level shifter of claim 1, wherein each of the plurality of output buffers comprises:

a pull-up element coupled between a gate high voltage terminal and an output node;

a pull-down element coupled between a gate low voltage terminal and the output node; and a modulation element coupled to the output node and an external voltage terminal, wherein the external voltage is larger than a gate low voltage and smaller than a gate high voltage.

5. The level shifter of claim 4, further comprising a resistor arranged between the output node and the external voltage terminal.

6. A display device comprising:

a display panel comprising a plurality of gate lines, a plurality of data lines, and a plurality of cells;

a timing controller configured to provide an on input signal and an off input signal according to timing;

a level shifter configured to provide a plurality of gate pulses in response to the on input signal and the off input signal;

a gate driver configured to drive the plurality of gate lines in response to the plurality of gate pulses; and a source driver configured to provide a plurality of data signals to the plurality of data lines, wherein the level shifter comprises:

a phase controller configured to determine the number of phases of the plurality of gate pulses using the on input signal and the off input signal, and sequentially generate a plurality of control signals according to the determined number;

a plurality of switching controllers configured to generate one or more switching signals in response to the plurality of control signals sequentially provided from the phase controller; and a plurality of output buffers configured to sequentially generate level-shifted gate pulses in response to the one or more switching signals, wherein the phase controller determines a number of the control signals in accordance with a number of clocks of the on input signal between a time at which the on input signal is inputted and another time at which the off input signal is inputted, and generates the plurality of control signals sequentially activated in response to the on input signal, and wherein the number of the phases of the gate pulses is determined in accordance with the number of the control signals, wherein the on input signal and the off input signal are different.

7. The display device of claim 6, wherein the phase controller determines the number of phases based on an input sequence or input counts of the on input signal and the off input signal.

8. The display device of claim 7, wherein the phase controller sets the number of phases to 2x when the off input signal is inputted after x clocks of the on input signal where x is a natural number.

9. The display device of claim 6, wherein the output buffer comprises:

a pull-up element coupled between a gate high voltage terminal and an output node;

a pull-down element coupled between a gate low voltage terminal and the output node; and a modulation element coupled to the output node and an external voltage terminal, wherein the external voltage is larger than a gate low voltage and smaller than a gate high voltage.

10. A level shifter comprising:

a phase controller configured to generate a plurality of control signals of which a number of control signals is determined according to an input relation between an on input signal and an off input signal, and sequentially output the plurality of control signals in response to the on input signal;

a plurality of switching controllers configured to generate one or more switching signals in response to the plurality of control signals sequentially provided from the phase controller; and a plurality of output buffers configured to sequentially output level-shifted gate pulses in response to the one or more switching signals provided from the plurality of switching controllers, wherein the phase controller determines a number of the control signals in accordance with a number of clocks of the on input signal between a time at which the on input signal is inputted and another time at which the off input signal is inputted, and generates the plurality of control signals sequentially activated in response to the on input signal received, and wherein the number of the phases of the gate pulses is determined in accordance with the number of the control signals, wherein the on input signal and the off input signal are different.

11. The level shifter of claim 10, wherein the phase controller determines the number of control signals according to the number of clocks of the on input signal, which are inputted until the off input signal is received after the on input signal is received.

* * * * *